(12) United States Patent
Blair

(10) Patent No.: US 6,617,900 B1
(45) Date of Patent: Sep. 9, 2003

(54) ARBITRATOR WITH NO METASTABLE VOLTAGE LEVELS ON OUTPUT

(75) Inventor: Gerard M Blair, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/494,598

(22) Filed: Jan. 31, 2000

(51) Int. Cl.[7] ............................................ H03K 3/356
(52) U.S. Cl. ........................ 327/201; 327/19; 327/215; 327/225
(58) Field of Search .................... 327/18, 19, 199–203, 327/208, 215–219, 223, 225

(56) References Cited

U.S. PATENT DOCUMENTS

| | | | |
|---|---|---|---|
| 4,841,178 A | * | 6/1989 | Bisson |
| 4,924,220 A | * | 5/1990 | Mihara et al. |
| 4,998,027 A | * | 3/1991 | Mihara et al. |
| 5,315,184 A | * | 5/1994 | Benhamida |
| 6,078,983 A | * | 6/2000 | Hanawa et al. ............. 710/240 |

OTHER PUBLICATIONS

Edited by C. A. R. Hoare: "Developments In Concurrency And Communication" p. cm.—University of Texas at Austin Year of Programming Series, ISBN 0–204–17232–1, (1990) Addison–Wesley Publishing Company, Inc., pp. v, Section 7 Arbiter and Synchronizer p. 21, Chapter 1 Martin: Programming in VLSI p. 22.

* cited by examiner

*Primary Examiner*—Kenneth B. Wells
(74) *Attorney, Agent, or Firm*—Alexander J. Neudeck

(57) ABSTRACT

An arbiter that includes a phase comparator receiving two input signals. The outputs of the phase comparator are propagated to a first SR type flip-flop. The outputs of the first SR type flip-flop are propagated to a second SR type flip-flop. The outputs of the second SR type flip-flop indicate which of the two input. signals changed first. The phase comparator can enter a metastable state. The first flip-flop reduces the magnitude of signal swing away from the power supply rails caused by the metastable state. The second flip-flop prevents any signal swing away for a power supply rail is not propagated to an output.

18 Claims, 1 Drawing Sheet

ARBITRATOR WITH NO METASTABLE VOLTAGE LEVELS ON OUTPUT

FIELD OF THE INVENTION

This invention relates generally to digital electronic circuits and more particularly to digital integrated circuits that determine which signal arrived first.

BACKGROUND OF THE INVENTION

Arbiters are used in digital electronics to determine which signal arrived first. This function has many uses in modem electronics. Some of the se uses include resource arbitration where two devices compete for a single resource (such as a memory, or signal bus) by sending a signal to an arbiter. The arbiter determines which device signaled for the resource first, and may then award that device use of that resource. Another example of the usefulness of arbiters is for phase comparison. An arbiter, since it indicates which of two signals arrived first, is useful as a phase comparator. An excellent example of this application is disclosed in a U.S. Pat. No. 6,323,714, titled SYSTEM AND METHOD FOR DESKEWING SYNCHRONOUS CLOCKS IN A VERY LARGE SCALE INTEGRATED CIRCUIT, which is hereby included by reference for all that is disclosed therein. This patent is commonly owned by the assignee of the present document and was filed in the United States Patent and Trademark Office on about the same day as the present application.

One problem with arbiters in general is the occurrence of a metastable condition. If both signals arrive together or very close together, the arbiter will generally enter a metastable state. When this occurs, the outputs may move to voltage levels that are not valid logic levels. These voltage levels may be called metastable voltage levels. This condition may last for an arbitrary period of time. Another problem that may arise is that some arbiter circuits may have outputs that can oscillate when the inputs oscillate. In other words, the outputs may not be steady between arbitrations. Both of these conditions, non-valid logic levels and oscillating outputs, can cause problems with the circuitry that receives them.

Accordingly, there is a need for a way to realize an arbiter that maintains a steady output state between arbitrations and yet never propagates a metastable voltage level to its outputs.

SUMMARY OF THE INVENTION

In a preferred embodiment, the invention provides an arbiter that maintains stability between arbitrations without propagating metastable voltage levels. This arbiter is well suited for fabrication in monolithic integrated circuits as well as other circuit technologies. In addition, the preferred embodiment is implemented using a complementary metal oxide semiconductor (CMOS) devices. CMOS devices and processes are commonly used in many VLSI or other integrated circuit designs, so this embodiment may be used in these devices.

The arbiter of the present invention includes a phase comparator receiving two input signals. The outputs of the phase comparator are propagated to a first SR type flip-flop. The outputs of the first SR type flip-flop are propagated to a second SR type flip-flop. The outputs of the second SR type flip-flop indicate which of the two input signals changed first.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
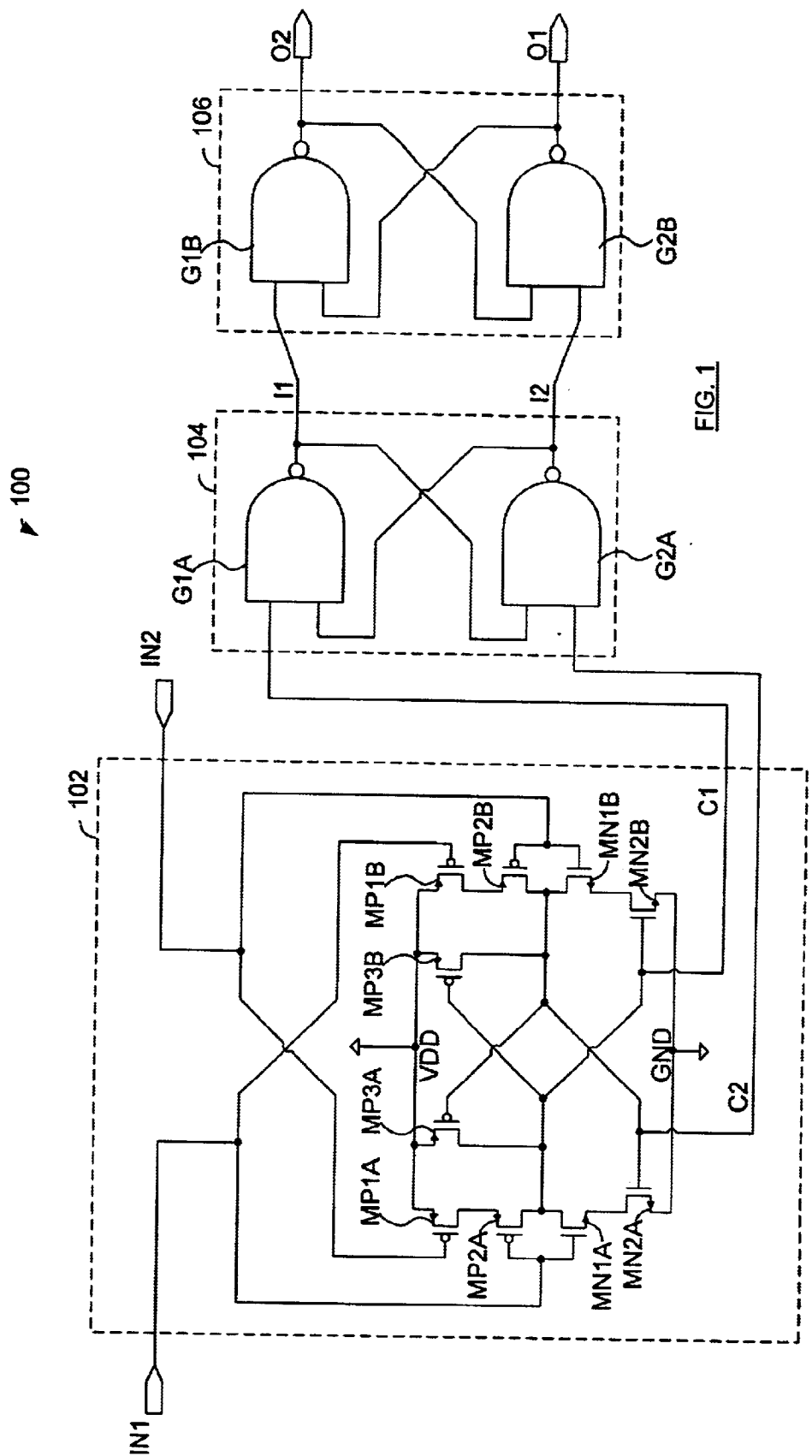
FIG. 1 is a schematic diagram of an arbiter according to the present invention.

The arbiter of the present invention includes a phase comparator receiving two input signals. The outputs of the phase comparator are propagated to a first SR type flip-flop. The outputs of the first SR type flip-flop are propagated to a second SR type flip-flop. The outputs of the second SR type flip-flop indicate which of the two input signals changed first. If the two inputs to the phase comparator change at the same time and the same rate it causes the phase comparator to go into a metastable state. During the metastable state, the outputs of the phase comparator leave a good logic voltage level and change together until the metastable condition ends. When the metastable condition ends, one output of the phase comparator goes to one logic state and the other output goes to the other logic state.

The outputs of the phase comparator are propagated to a first SR type flip-flop. When the outputs of the phase comparator change together during a metastable state, the outputs of the first SR type flip-flop will either not change at all or will only change by an amount that is less than the amount of change required to cause the second SR type flip-flop to change its outputs. This is because of the feedback inherent in an SR type flip-flop which causes SR type flip-flops to have hysteresis. Thus, the non-good logic levels output by the phase comparator during a metastable state do not propagate to the output of the arbiter of the present invention.

FIG. 1 is a schematic diagram of a CMOS arbiter 100 according to the present invention. Input signals IN1 and IN2 are input to phase comparator 102. These signals are normally at a low logic level and the arbiter 100 functions to determine which of these signals transitions to a high logic level first. The outputs of phase comparator 102 are signals C1 and C2. These signals are normally both at a high logic level until at least one of the inputs IN1 and IN2 begins to transition. If IN1 transitions before IN2, then output C1 falls to a low logic level. Likewise, if IN2 transitions before IN1, then output C2 falls to a low logic level. If both IN1 and IN2 transition at the same time, then phase comparator 102 enters a metastable state and both C1 and C2 fall together until the metastable condition ends at which time one of the two signals will continue to fall all the way to a low logic level and the other will rise back to a high logic level.

Signals C1 and C2 are input to the first SR type flip-flop 104. SR flip-flop 104 is constructed from two cross-coupled NAND gates G1A and G2A. The outputs of SR flip-flop 104 are signals I1 and I2. These signals are input to SR type flip-flop 106. SR flip-flop 106 is constructed from two cross-coupled NAND gates G1B and G2B. The outputs of SR flip-flop 106 are signals O1 and O2.

In non-metastable operation, when C1 falls to a low logic level and C2 remains at a high logic level, signal I1 will transition to a high logic level if it was originally low, or remain at a high logic level if it was originally high and signal I2 will transition to a low logic level if it was originally high, or remain at a low logic level if it was originally low. This ending condition, I1 at a high logic level and I2 at a low logic level, ensures that O2 is low and O1 is high. This indicates that IN1 changed before IN2.

Likewise, when C2 falls to a low logic level and C1 remains at a high logic level, signal I2 will transition to a high logic level if it was originally low, or remain at a high logic level if it was originally high and signal I1 will transition to a low logic level if it was originally high, or remain at a low logic level if it was originally low. This ending condition, I2 at a high logic level and I1 at a low logic level, ensures that O1 is low and O2 is high. This indicates that IN2 changed before IN1.

When C1 and C2 fall together during a metastable condition, the feedback provided by I1 and I2 to the other inputs of NAND gates G1A and G2A prevents SR flip-flop 104 from changing state. When both C1 and C2 are reasonably close to a strong low logic level, it may cause the one of I1 and I2 that is at the low logic level to begin to swing away from that low logic level. At the same time, this swing away from the low logic level may cause the other one of I1 and I2 that is at the high logic level to swing away from that high logic level. However, the amount that these metastable voltages swing away from the logic level they were at is not enough to change the output of SR flip-flop 106. Accordingly, no intermediate or metastable logic levels propagate to the outputs O1 and O2 until the metastable condition resolves. When the metastable condition resolves, O1 and O2 may make clean transitions to new logic levels, or stay the same, depending on how the metastable condition resolved.

The phase comparator 102 of the preferred embodiment as shown in FIG. 1 is now described. Input IN1 is connected to the gate of n-channel MOSFET (NFET) MN1A. Input IN1 is also connected to the gates of p-channel MOSFETs (PFETs) MP2A and MP1B. Input IN2 is connected to the gate of NFET MN1B. Input IN2 is also connected to the gates of PFETs MP2B and MP1A.

The source of MP1A is connected to a positive supply voltage, VDD. The drain of MP1A is connected to the source of MP2A. The drain of MP2A is connected to the drains of MN1A and PFET MP3A, and the gates of PFET MP3B and NFET MN2B. This node is also output C1 of comparator 102. The source of MN1A is connected to the drain of NFET MN2A. The source of MN2A is connected to a negative supply voltage, GND. The source of MP3B is connected to a positive supply voltage, VDD.

The source of MP1B is connected to a positive supply voltage, VDD. The drain of MP1B is connected to the source of MP2B. The drain of MP2B is connected to the drains of MN1B and PFET MP3B, and the gates of PFET MP3A and NFET MN2A. This node is also output C2 of comparator 102. The source of MN1B is connected to the drain of NFET MN2B. The source of MN2B is connected to a negative supply voltage, GND. The source of MP3A is connected to a positive supply voltage, VDD.

From the foregoing it will be apparent that the invention provides a novel and advantageous signal arbiter. This arbiter maintains stability between arbitrations without propagating metastable voltage levels. This arbiter is well suited for fabrication in monolithic integrated circuits as well as other circuit technologies. The preferred embodiment is implemented using a complementary metal oxide semiconductor (CMOS) devices. However, since the basic building blocks used in the present invention comprise a phase comparator and flip-flops that exist in one form or another in almost all process and circuit technologies, it may also be implemented in other circuit technologies such a NMOS or bipolar integrated circuits.

Although a specific embodiment of the invention has bee described and illustrated, the invention is not to be limited to the specific forms or arrangements of parts so described and illustrated. The invention is limited on by the claims.

What is claimed is:

1. An arbiter, comprising:

a phase comparator having a first output that propagates a first metastable voltage level when a first input and a second input transition;

a first flip-flop receiving said first metastable voltage level and having a second output that propagates a second metastable voltage level in response to said first metastable voltage level; and, a second flip-flop receiving said second metastable voltage level and having a third output that does not propagate a metastable voltage level when said second metastable voltage level is received.

2. The arbiter of claim 1, wherein said first output comprises two signals whereby one of said two signals propagates said first metastable voltage level.

3. The arbiter of claim 1, wherein said second output comprises two signals whereby one of said two signals propagates said second metastable voltage level.

4. The arbiter of claim 1, wherein said first flip-flop is an SR type flip-flop.

5. The arbiter of claim 1, wherein said second flip-flop is an SR type flip-flop.

6. The arbiter of claim 4, wherein said second flip-flop is an SR type flip-flop.

7. An arbiter, comprising:

a phase comparator, said phase comparator having a first input, a second input, a first output, and a second output, wherein at least one of said first output and said second output changes from a first output state to a metastable output state when said first input and said second input switch from a first voltage level to a second voltage level at nearly the same time;

a first feedback circuit receiving said first output and said second output and producing a first feedback circuit output and a second feedback circuit output; and, a second feedback circuit receiving said first feedback circuit output and said second feedback circuit output.

8. The arbiter of claim 7, wherein said first feedback circuit has hysteresis.

9. The arbiter of claim 8, wherein said second feedback circuit has hysteresis.

10. The arbiter of claim 8 wherein said first feedback circuit is a flip-flop.

11. The arbiter of claim 10 wherein said first feedback circuit is an SR type flip-flop.

12. The arbiter of claim 8 wherein said second feedback circuit is a flip-flop.

13. The arbiter of claim 12 wherein said second feedback circuit is an SR type flip-flop.

14. A method of arbitrating between signals, comprising:

comparing a first signal and a second signal to each other wherein the result of said comparing is one of a metastable state and a stable state;

latching and propagating said stable state to a second latching stage if said result of said comparing is a stable state; and propagating a reduced version of said metastable state to said second latching stage if said result of said comparing is a metastable state.

15. A method of arbitrating between signals, comprising:

comparing a first signal and a second signal to each other wherein the result of said comparing is one of a metastable state and a stable state;

latching and propagating said stable state to a second latching stage if said result of said comparing is a stable state;

propagating a reduced version of said metastable state to said second latching stage if said result of said comparing is a metastable state; and latching said stable state with said second latching stage and not latching said reduced version of said metastable state with said second latching stage.

16. An arbiter, comprising:

phase comparison means that can enter a metastable state producing metastable voltages on at least one output;

latching means that receives said metastable voltages; and, output means that receives a latched signal from said latching means and produces an output signal without metastable voltages.

17. The arbiter of claim 16 wherein said output means is also a latching means.

18. The arbiter of claim 17 wherein said latching means comprises two flip-flops.

* * * * *